(12) United States Patent
Lim et al.

(10) Patent No.: US 10,374,589 B2
(45) Date of Patent: Aug. 6, 2019

(54) VOLTAGE COMPARING CIRCUIT AND VOLTAGE COMPARING METHOD

(71) Applicant: PixArt Imaging Inc., Hsin-Chu (TW)

(72) Inventors: Wooi Kip Lim, Penang (MY); Yong Yeap Tan, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 16/136,136

(22) Filed: Sep. 19, 2018

(65) Prior Publication Data
US 2019/0020335 A1 Jan. 17, 2019

Related U.S. Application Data

(63) Continuation of application No. 15/250,950, filed on Aug. 30, 2016, now Pat. No. 10,116,295.

(51) Int. Cl.
| H03K 5/22 | (2006.01) |
| H03K 5/24 | (2006.01) |
| G01K 7/34 | (2006.01) |
| G01K 15/00 | (2006.01) |

(52) U.S. Cl.
CPC ............... H03K 5/24 (2013.01); G01K 7/34 (2013.01); G01K 15/005 (2013.01)

(58) Field of Classification Search
CPC ........ H03K 5/2481; H03K 5/249; H03K 5/24; H03K 5/08; H03K 5/153; H03K 5/1534; H03K 3/2893; G01K 7/34; G01K 7/01; G01K 7/015; G01K 3/005; G01K 7/21; G01K 7/40; G01K 7/25
See application file for complete search history.

(56) References Cited

U.S. PATENT DOCUMENTS

| 10,116,295 B2 * | 10/2018 | Lim ................... G01K 7/34 |
| 2006/0170463 A1 | 8/2006 | Yonezawa |
| 2007/0009006 A1 * | 1/2007 | Yang ................... G01K 7/01 374/1 |
| 2007/0057707 A1 | 3/2007 | Uchimoto |
| 2014/0043081 A1 | 2/2014 | Chen |

FOREIGN PATENT DOCUMENTS

CN 101943716 A 1/2011

* cited by examiner

*Primary Examiner* — Long Nguyen
(74) *Attorney, Agent, or Firm* — Winston Hsu

(57) ABSTRACT

A temperature detecting circuit comprising: a comparator, comprising a first comparing terminal and a second comparing terminal; a time interval computing unit; a switch module, coupled to the first comparing terminal and the second comparing terminal, comprising a reference voltage terminal coupled to a reference voltage source, and comprising a first input terminal, a second input terminal and a third input terminal; a first current source, comprising a first charging terminal coupled to the first input terminal and the second input terminal; a first capacitor, coupled to the first current source at the first charging terminal; a capacitance adjusting unit, coupled to the first capacitor; a second current source, comprising a second charging terminal coupled to the third input terminal, wherein the second current source is a current source which provides a constant current; and a second capacitor, coupled to the second current source at the second charging terminal.

4 Claims, 5 Drawing Sheets

VOLTAGE COMPARING CIRCUIT AND VOLTAGE COMPARING METHOD

CROSS REFERENCE TO RELATED APPLICATIONS

This application is a continuation of applicant's earlier application, Ser. No. 15/250,950, filed Aug. 30, 2016, and is included herein by reference.

BACKGROUND OF THE INVENTION

1. Field of the Invention

The present invention relates to a voltage comparing circuit and a voltage comparing method, and particularly relates to a voltage comparing circuit and a voltage comparing method which can be applied to detect a temperature.

2. Description of the Prior Art

A conventional temperature detecting circuit always detects the temperature via computing at least charging time interval of at least one current source. However, the current generated by the current source may drift due to temperature variation or other factors. Accordingly, the temperature detecting result may be inaccurate.

SUMMARY OF THE INVENTION

Therefore, one objective of the present application is to provide a voltage comparing circuit and a voltage comparing method that can be applied for temperature detecting.

One embodiment of the present application discloses a temperature detecting circuit comprising: a comparator, comprising a first comparing terminal and a second comparing terminal; a time interval computing unit; a switch module, coupled to the first comparing terminal and the second comparing terminal, comprising a reference voltage terminal coupled to a reference voltage source, and comprising a first input terminal, a second input terminal and a third input terminal; a first current source, comprising a first charging terminal coupled to the first input terminal and the second input terminal; a first capacitor, coupled to the first current source at the first charging terminal; a capacitance adjusting unit, coupled to the first capacitor; a second current source, comprising a second charging terminal coupled to the third input terminal, wherein the second current source is a current source which provides a constant current; and a second capacitor, coupled to the second current source at the second charging terminal.

In view of above-mentioned embodiments, the current source can be calibrated such that the voltage comparing result and the temperature detecting result can be more accurate.

These and other objectives of the present invention will no doubt become obvious to those of ordinary skill in the art after reading the following detailed description of the preferred embodiment that is illustrated in the various figures and drawings.

DETAILED DESCRIPTION

In following descriptions, several embodiments are provided to explain the concept of the present invention. It will be appreciated that although the following voltage comparing circuit and the voltage comparing method are used for temperature detecting, it does not mean the voltage comparing circuit and the voltage comparing method are limited for temperature detecting. The following voltage comparing circuit and the voltage comparing method can be used for other applications. The voltage comparing circuits illustrated below can be regarded as temperature detecting circuits while the voltage comparing circuits are applied for detecting temperatures.

Figure 1:
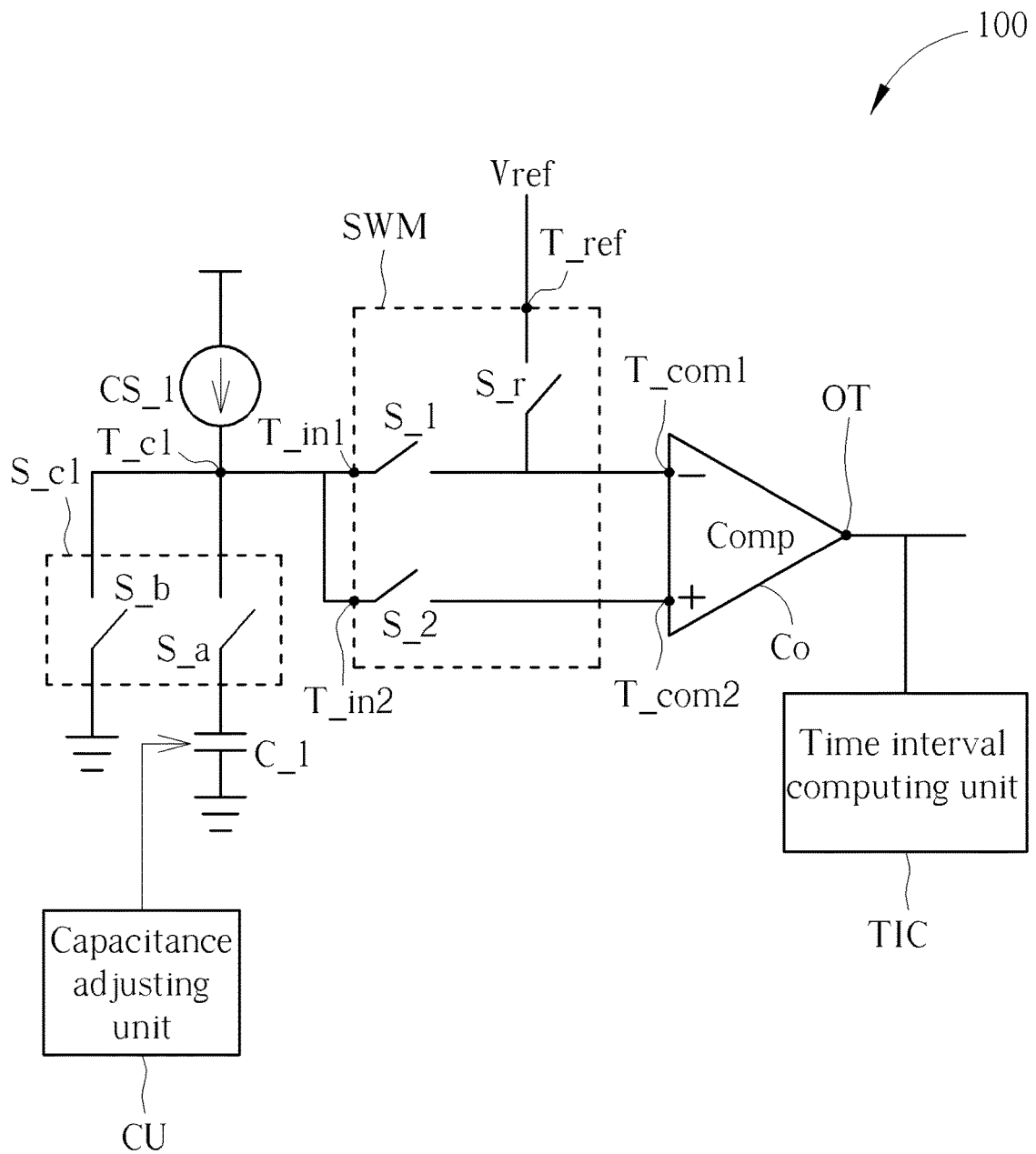
FIG. 1 is a circuit diagram illustrating a voltage comparing circuit according to one embodiment of the present invention.

FIG. 1 is a circuit diagram illustrating a voltage comparing circuit 100 according to one embodiment of the present invention. As illustrated in FIG. 1, the voltage comparing circuit 100 comprises a comparator Co, a time interval computing unit TIC (ex. a counter), a switch module SWM, a first current source CS_1, a first capacitor C_1, and a capacitance adjusting unit CU (ex. a processing unit). If the voltage comparing circuit 100 is applied for detecting a temperature, the time interval computing unit TIC can be regarded as a temperature computing unit.

The comparator Co comprises a first comparing terminal T_com1 and a second comparing terminal T_com2. The time interval computing unit TIC is coupled to but not limited to an output terminal OT of the comparator Co. The switch module SWM is coupled to the first comparing terminal T_com1 and the second comparing terminal T_com2, comprises a reference voltage terminal T_ref coupled to a reference voltage source Vref, and comprises a first input terminal T_in1 and a second input terminal T_in2.

The first current source CS_1 comprises a first charging terminal T_c1 coupled to the first input terminal T_in1 and the second input terminal T_in2. The first capacitor C_1 is coupled to the first current source CS_1 at the first charging terminal T_c1. The capacitance adjusting unit CU is coupled to the first capacitor C_1. In one embodiment, the switch module SWM comprises but not limited to a first switch S_1, a second switch S_2 and a reference switch S_r. The reference switch S_r is coupled between the reference voltage source Vref and the first comparing terminal T_com1. The first switch S_1 is coupled between the first input terminal T_in1 and the first comparing terminal T_com1. The second switch S_1 is coupled between the second input terminal T_in2 and the second comparing terminal T_com2.

Besides, in one embodiment, the voltage comparing circuit 100 further comprises a first charging switch module S_c1, which comprises switches S_a and S_b. If the switch S_a is conductive but the switch S_b is non-conductive, the first capacitor C_1 is charged. On the opposite, if the switch S_a is non-conductive but the switch S_b is conductive, the first capacitor C_1 is discharged The operations for the voltage comparing circuit 100 in a first calibration mode are described as below, please also refer to FIG. 3 and FIG. 4 to understand the operations for more clear.

As stated in the prior art, a current source may have drift due to temperature variation or other factors, therefore the current source needs to be calibrated. Accordingly, in the first calibration mode, which means the first current source CS_1 is calibrated, the reference switch S_r is conductive (i.e. the switch signal SS_r in FIG. 3 has a high logic value), thus the first comparing terminal T_com1 receives a reference voltage provided by the reference voltage source via the switch module SWM. Also, the second switch S_2 is also conductive (i.e. the switch signal SS_2 in FIG. 3 has a high logic value) in the first calibration mode, thus the first charging terminal T_c1 is coupled to the second comparing terminal T_com2 via the switch module SWM, and the first current source CS_1 charges the first capacitor C_1.

Also, in the first calibration mode, the time interval computing unit TIC computes a first charging time interval (T1 in FIG. 3 and FIG. 4) between a time point that the first current source CS_1 starts to charge the first capacitor C_1 and a time point that a first charging voltage V_c1 at the first charging terminal T_1 is equal to the reference voltage Vref (i.e. an output signal SOT at the output terminal toggles). Besides, please note the first capacitor C_1 is charged while the charging signal SS_c1 in FIG. 3 has a high logic level.

Figure 4:
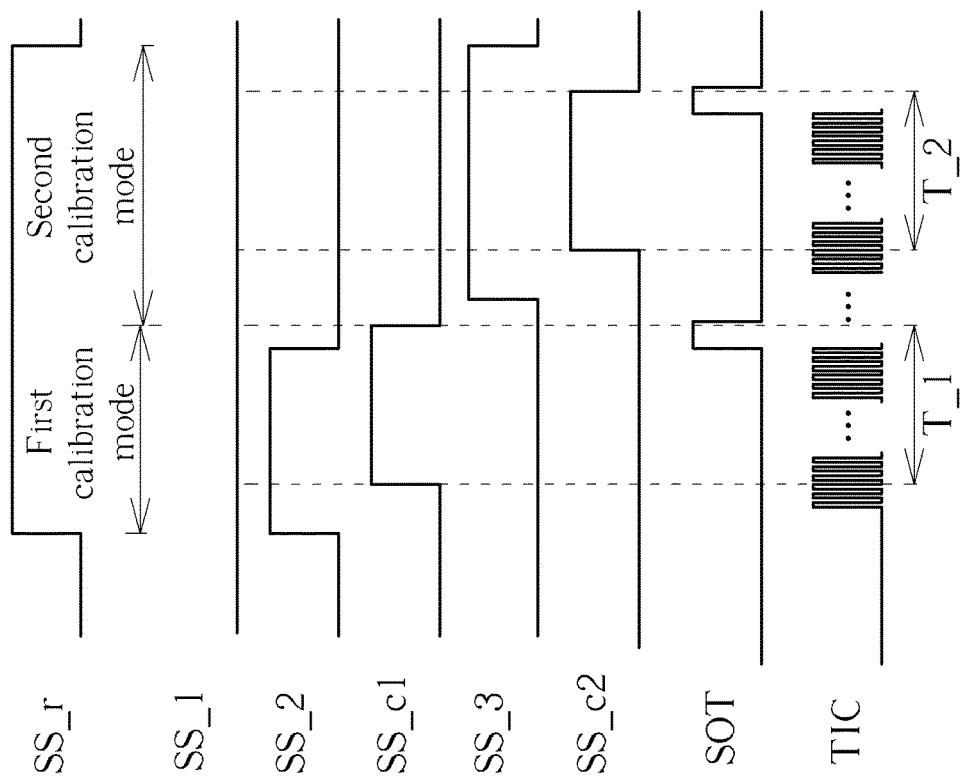

Furthermore, the capacitance adjusting unit CU compares the first charging time interval T_1 with a first ideal charging time interval T_1s, and adjusts first capacitance of the first capacitor C_1 if the first charging time interval T_1 is not equal to the first ideal charging time interval T_1s. By this way, the first charging time interval T_1 can be adjusted to the first ideal charging time interval T_1s, as illustrated in FIG. 4.

The first ideal charging time interval T_1s can be any predetermined value. In one embodiment, the first current source CS_1 is a current source which is linear across a temperature, for example, a PTAT (Proportional to Absolute Temperature) circuit. Accordingly, the first current source CS_1 is supposed to output a specific current at a specific temperature. In one example, first current source CS_1 is supposed to output 1 uA at 25 degrees Celsius, the reference voltage Vref is 1.2V and the first capacitor has capacitance of 3 pF. In such case, the first ideal charging time interval T_1s is 3.6 us. However, the first current source CS_1 may output a current which is not equal to 1 uA, thus the first charging time interval T_1 is not equal to 3.6 us. If such inaccurate first charge source CS_1 is applied for temperature detecting, the temperature detecting result will be inaccurate. Therefore, the first capacitance of the first capacitor C_1 is adjusted, such that the first charging time interval corresponding to a specific temperate can be maintained even if the first current source CS_1 has drift.

Figure 2:
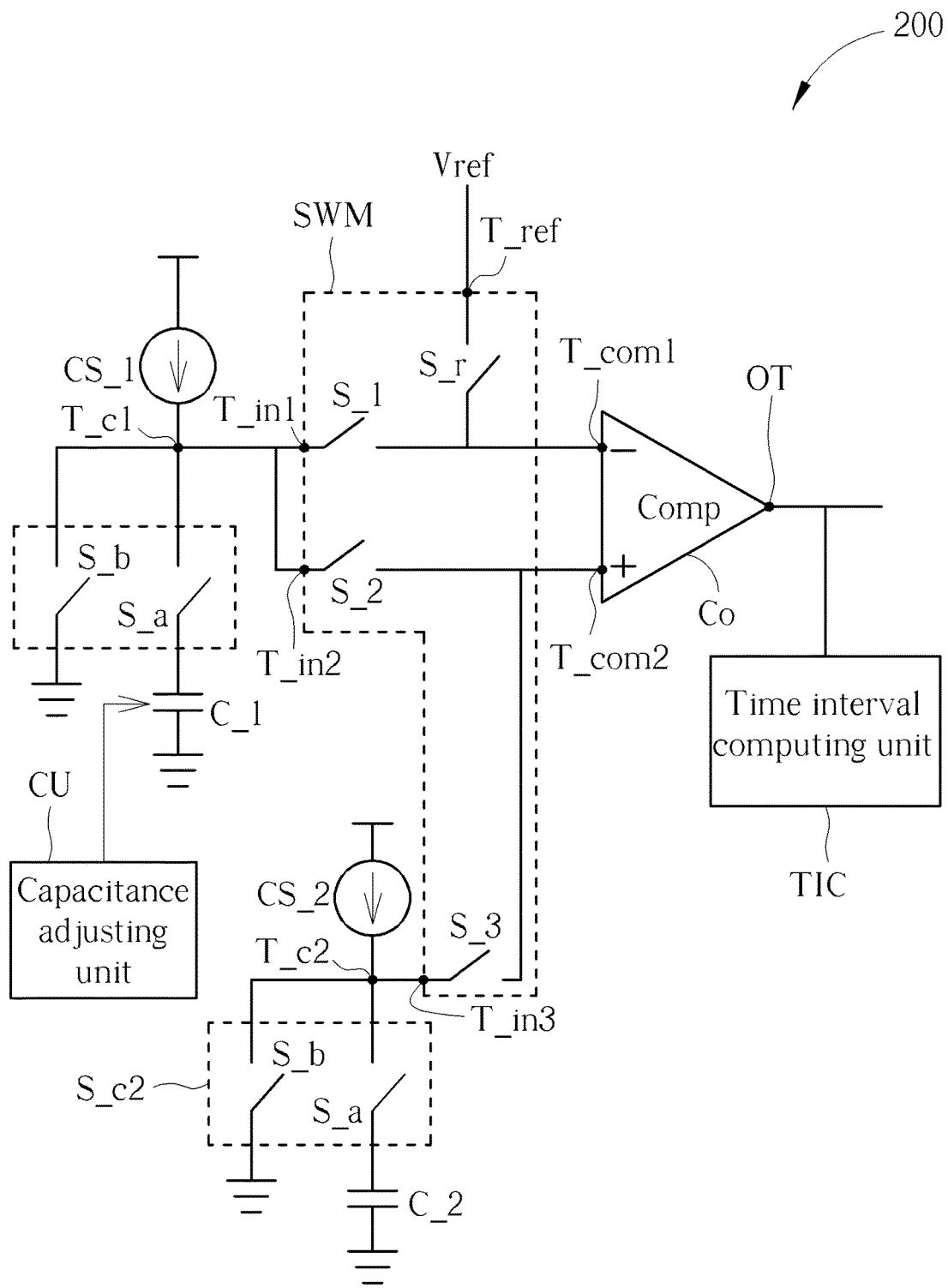
FIG. 2 is a circuit diagram illustrating a voltage comparing circuit according to another embodiment of the present invention.

The second comparing terminal T_com2 can be coupled to any circuit. In the embodiment illustrated in FIG. 2, the second comparing terminal T_com2 is coupled to another current source. As illustrated in FIG. 2, besides the devices illustrated in FIG. 1, the voltage comparing circuit 200 further comprises a second current source CS_2, a second capacitor C_2 and a second charging switch module S_c2. Also, the switch module SWM comprises a third input terminal T_in3 and a third switch S_3 coupled to the third input terminal T_in3. In one embodiment, the second current source CS_2 is a constant current source which provides a constant current, and the voltage comparing circuit 200 is applied for temperature detecting.

Figure 5:
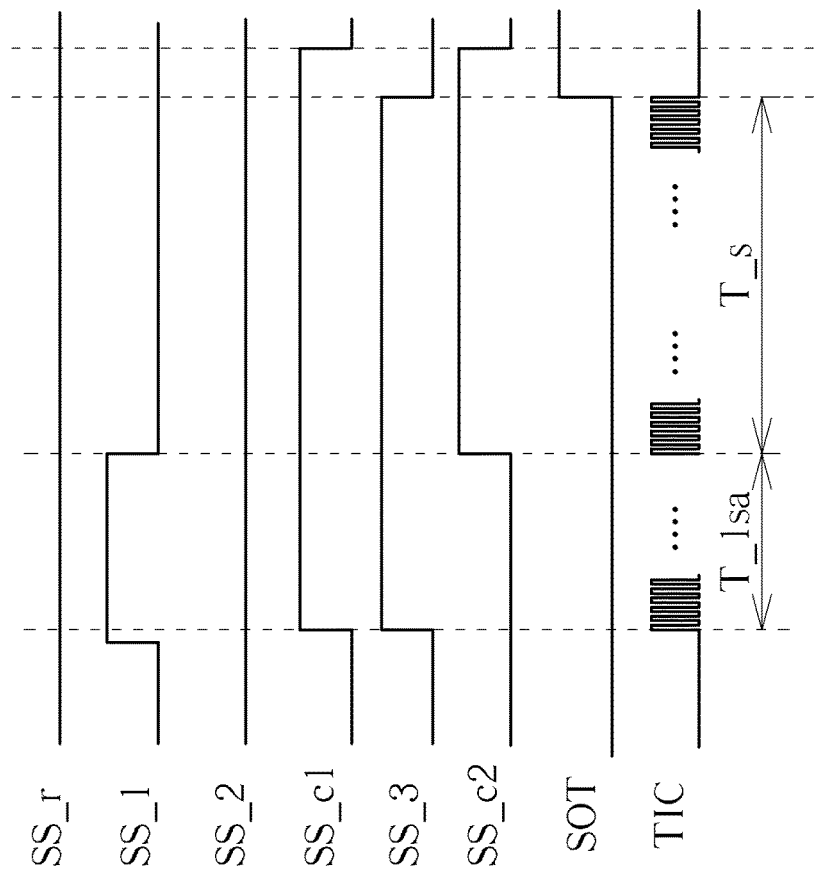
FIG. 5 and FIG. 6 are schematic diagrams illustrating the operations for the voltage comparing circuit in the normal mode.
Figure 6:
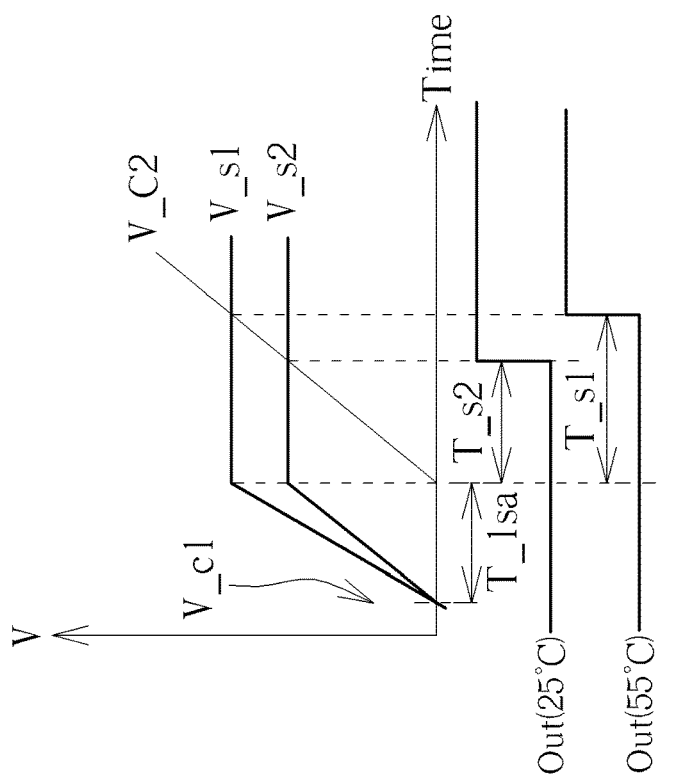

The operations for temperature detecting (i.e. the voltage comparing circuit 200 operates in a normal mode) are illustrated in following descriptions for FIG. 5 and FIG. 6.

In the normal mode, the first comparing terminal T_com1 does not receive the reference voltage Vref (i.e. the reference switch S_r is non-conductive), the first charging terminal T_c1 is firstly coupled to the first comparing terminal T_com1 (i.e. the first switch SW_1 is conductive), and the first current source CS_1 charges the first capacitor C_1 (i.e. the charging signal SS_c1 has a high logic value).

Also, in the normal mode, the second current source CS_1 starts to charge the second capacitor C_2 (i.e. the charging signal SS_c2 has a high logic value) if the first charging voltage V_c1 reaches a saturation charging voltage (i.e. the first capacitor C_1 is charged longer or equal to the charging time interval T_1sa). Besides, in the normal mode, the time interval computing unit TIC computes a saturation charging time interval T_s between a time point that the second current source CS_2 starts to charge the second capacitor C_2 and a time point that the second charging voltage V_c2 is equal to the saturation charging voltage.

As above-mentioned, the first current source CS_1 is a current source which is linear across a temperature, thus the saturation charging voltages are different corresponding to different temperatures. As illustrated in FIG. 6, the saturation charging voltage is V_s1 while the temperature is 55 degrees Celsius and the saturation charging voltage is V_s2 while the temperature is 25 degrees Celsius. Therefore, the saturation charging time intervals are also different corresponding to different temperatures. As illustrated in FIG. 6, the saturation charging time interval is T_s1 while the temperature is 55 degrees Celsius and the saturation charging time interval is T_s2 while the temperature is 25 degrees Celsius. By this way, the temperature can be detected if a current saturation charging time interval is acquired.

Figure 3:
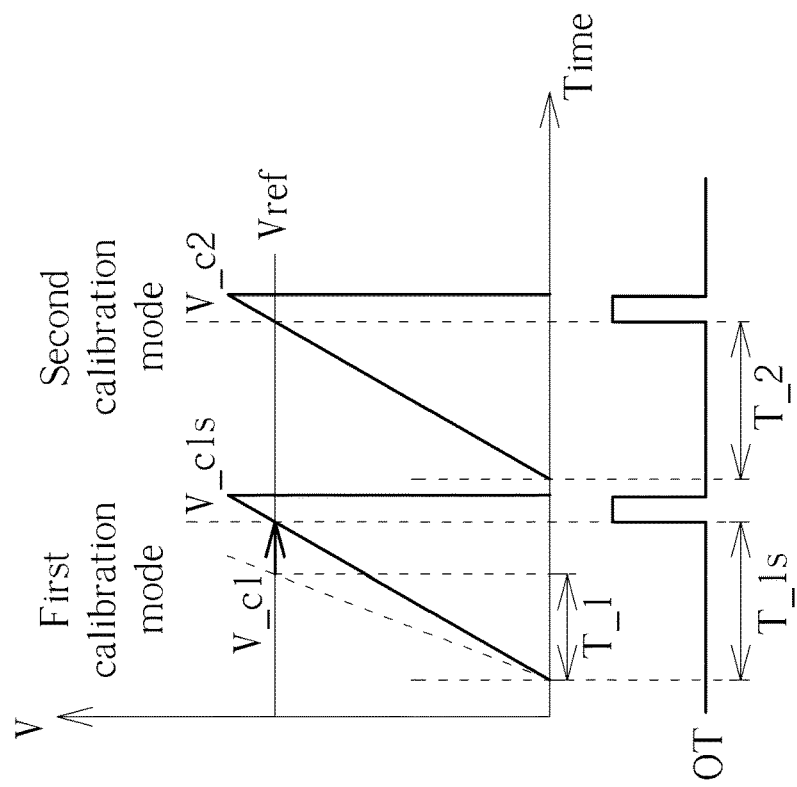
FIG. 3 and FIG. 4 are schematic diagrams illustrating the operations for the voltage comparing circuit in the first calibration mode and the second calibration mode.

Similar with the first current source CS_1, the second current source CS_2 can be calibrated as well, but not limited. As illustrated in FIG. 3 and FIG. 4, in a second calibration mode, the first comparing terminal T_com1 receives the reference voltage Vref via the switch module SWM, the second charging terminal T_c2 is coupled to the second comparing terminal T_com2 via the switch module SWM, and the second current source CS_2 charges the second capacitor C_2 (i.e. the second charging signal SS_c2 is high). Also, in the second calibration mode, the time interval computing unit TIC computes a second charging time interval T_2 between a time point that the second current source CS_2 starts to charge the second capacitor C_2 and a time point that the second charging voltage V_c2 is equal to the reference voltage Vref. The capacitance adjusting unit CU compares the second charging time interval T_2 with a second ideal charging time interval, and adjusts second capacitance of the second capacitor C_2 if the second charging time interval T_2 is not equal to the second ideal charging time interval. In the embodiment of FIG. 4, the second capacitance for the second capacitor C_2 is not adjusted since the second charging time interval T_2 is equal to the second ideal charging time interval.

Figure 7:
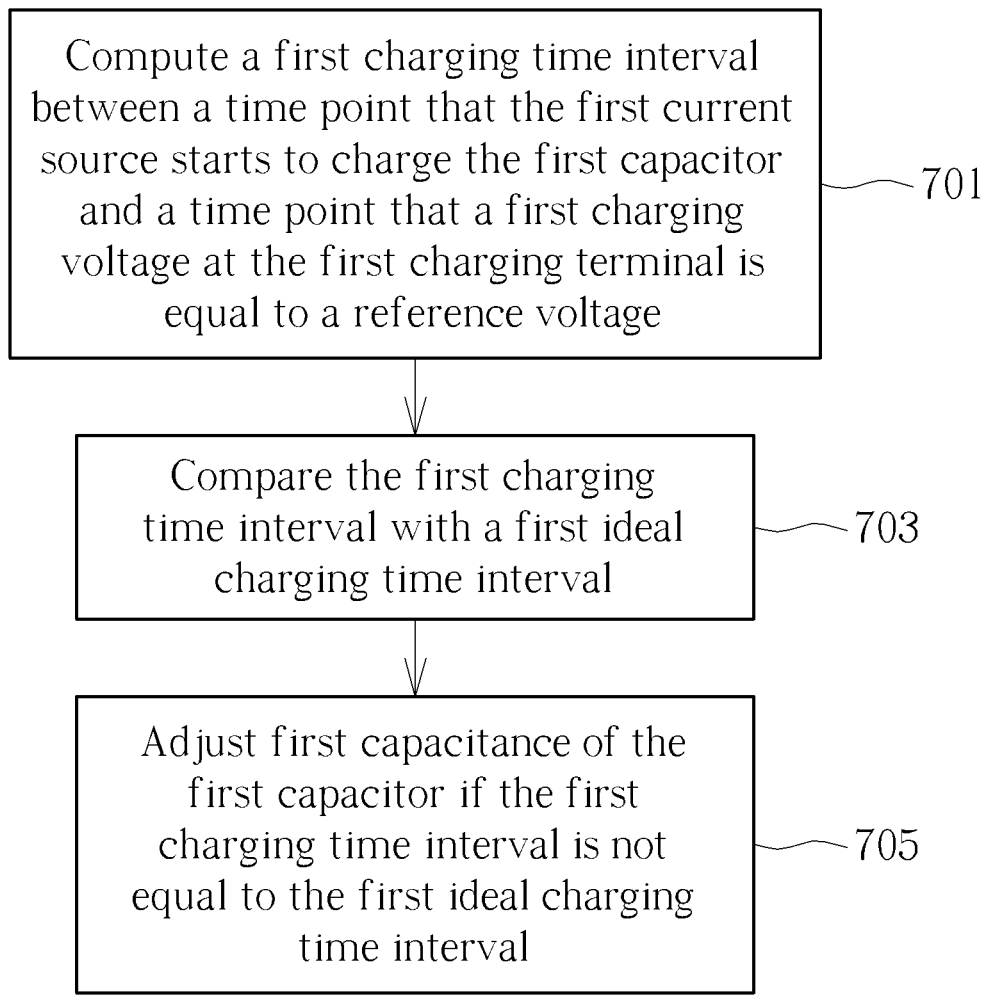
FIG. 7 is a flow chart illustrating a voltage comparing method according to one embodiment of the present invention.

In view of above-mentioned embodiments, a voltage comparing method can be acquired, which is applied to a voltage comparing circuit comprising a first current source (ex. CS_1 in FIG. 1) and a first capacitor (ex. C_1 in FIG. 1) coupled to the first current source at a first charging terminal. The voltage comparing method comprises the steps illustrated in FIG. 7, as below.

Step 701

Compute a first charging time interval (ex. T_1 in FIG. 3 and FIG. 4) between a time point that the first current source starts to charge the first capacitor and a time point that a first charging voltage at the first charging terminal is equal to a reference voltage, in a first calibration mode.

Step 703

Compare the first charging time interval with a first ideal charging time interval (ex. T_1s in FIG. 4).

Step 705

Adjust first capacitance of the first capacitor if the first charging time interval is not equal to the first ideal charging time interval.

In view of above-mentioned embodiments, the current source can be calibrated such that the voltage comparing result and the temperature detecting result can be more accurate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A temperature detecting circuit, comprising:
   a comparator, comprising a first comparing terminal and a second comparing terminal;
   a time interval computing unit;
   a switch module, coupled to the first comparing terminal and the second comparing terminal, comprising a reference voltage terminal coupled to a reference voltage source, and comprising a first input terminal, a second input terminal and a third input terminal;
   a first current source, comprising a first charging terminal coupled to the first input terminal and the second input terminal;
   a first capacitor, coupled to the first current source at the first charging terminal;
   a capacitance adjusting unit, coupled to the first capacitor;
   a second current source, comprising a second charging terminal coupled to the third input terminal, wherein the second current source is a current source which provides a constant current; and
   a second capacitor, coupled to the second current source at the second charging terminal.

2. The temperature detecting circuit of claim 1,
   wherein, in a first calibration mode, the first comparing terminal receives a reference voltage provided by the reference voltage source via the switch module, the first charging terminal is coupled to the second comparing terminal via the switch module, and the first current source charges the first capacitor;
   wherein, in the first calibration mode, the time interval computing unit computes a first charging time interval between a time point that the first current source starts to charge the first capacitor and a time point that a first charging voltage at the first charging terminal is equal to the reference voltage;
   wherein the capacitance adjusting unit compares the first charging time interval with a first ideal charging time interval, and adjusts first capacitance of the first capacitor if the first charging time interval is not equal to the first ideal charging time interval;
   wherein, in a normal mode, the first comparing terminal does not receive the reference voltage, the first charging terminal is coupled to the first comparing terminal, and the first current source charges the first capacitor;
   wherein, in the normal mode, the second current source starts to charge the second capacitor if the first charging voltage reaches a saturation charging voltage;
   wherein, in the normal mode, the time interval computing unit computes a saturation charging time interval between a time point that the second current source starts to charge the second capacitor and a time point that the second charging voltage is equal to the saturation charging voltage.

3. The temperature detecting circuit of claim 2, wherein the first current source is a current source which is linear across a temperature, wherein the second current source is a current source which provides a constant current.

4. The temperature detecting circuit of claim 2,
   wherein, in a second calibration mode, the first comparing terminal receives the reference voltage via the switch module, the second charging terminal is coupled to the second comparing terminal via the switch module, and the second current source charges the second capacitor;
   wherein, in the second calibration mode, the time interval computing unit computes a second charging time interval between a time point that the second current source starts to charge the second capacitor and a time point that the second charging voltage is equal to the reference voltage;
   wherein the capacitance adjusting unit compares the second charging time interval with a second ideal charging time interval, and adjusts second capacitance of the second capacitor if the second charging time interval is not equal to the second ideal charging time interval.

* * * * *